US008572907B2

(12) United States Patent
Sahlin et al.

(10) Patent No.: US 8,572,907 B2
(45) Date of Patent: Nov. 5, 2013

(54) ATTACHMENT SYSTEM OF PHOTOVOLTAIC CELL TO FLUOROPOLYMER STRUCTURAL MEMBRANE

(75) Inventors: Katherine M. Sahlin, Old Orchard Beach, ME (US); Marcel Dery, Westford, MA (US); Michael P. Cushman, Merrimack, NH (US)

(73) Assignee: Saint-Gobain Performance Plastics Corporation, Aurora, OH (US)

( * ) Notice: Subject to any disclaimer, the term of this patent is extended or adjusted under 35 U.S.C. 154(b) by 731 days.

(21) Appl. No.: 12/707,876

(22) Filed: Feb. 18, 2010

(65) Prior Publication Data

US 2010/0206377 A1  Aug. 19, 2010

Related U.S. Application Data

(60) Provisional application No. 61/153,786, filed on Feb. 19, 2009, provisional application No. 61/231,184, filed on Aug. 4, 2009.

(51) Int. Cl.
*E04D 13/18* (2006.01)

(52) U.S. Cl.
USPC ........................................................ 52/173.3

(58) Field of Classification Search
USPC ............ 52/173.3, 220, 22, 251, 586.1, 586.2, 52/582.1, 656.1, 665; 126/623, 704; 136/244, 251; 403/292
See application file for complete search history.

(56) References Cited

U.S. PATENT DOCUMENTS

| 4,860,509 A | 8/1989 | Laaly et al. |
| 6,311,436 B1 * | 11/2001 | Mimura et al. ............... 52/173.3 |
| 7,342,171 B2 | 3/2008 | Khouri et al. |
| 7,901,778 B2 | 3/2011 | Swei et al. |
| 8,039,739 B1 * | 10/2011 | Capps et al. .................. 136/259 |
| 2007/0266672 A1 | 11/2007 | Bateman et al. |
| 2008/0229704 A1 | 9/2008 | Augustyniak et al. |
| 2008/0245399 A1 | 10/2008 | DeLiddo |
| 2008/0245404 A1 | 10/2008 | Deliddo |
| 2011/0041891 A1 * | 2/2011 | Rummens et al. ............ 136/244 |
| 2012/0090661 A1 * | 4/2012 | Capps et al. .................. 136/246 |

FOREIGN PATENT DOCUMENTS

| EP | 0829909 | 3/1998 |
| EP | 1923920 | 5/2008 |
| JP | 2004-036098 | 2/2004 |
| JP | 2004-276304 | 10/2004 |
| JP | 2006-241761 | 9/2006 |
| JP | 2007-208213 | 8/2007 |
| WO | 2008/063660 | 5/2008 |

OTHER PUBLICATIONS

International Search Report PCT/US2010/024675 dated Oct. 13, 2010 (3 pgs.).

* cited by examiner

*Primary Examiner* — Mark Wendell
(74) *Attorney, Agent, or Firm* — Fulbright & Jaworski, L.L.P.; Scott D. Rothenberger; Colin L. Fairman

(57) ABSTRACT

The invention describes an extensible membrane system to which a photovoltaic device is removably attached via hook and loop fabric, or equivalent thereof.

17 Claims, 4 Drawing Sheets

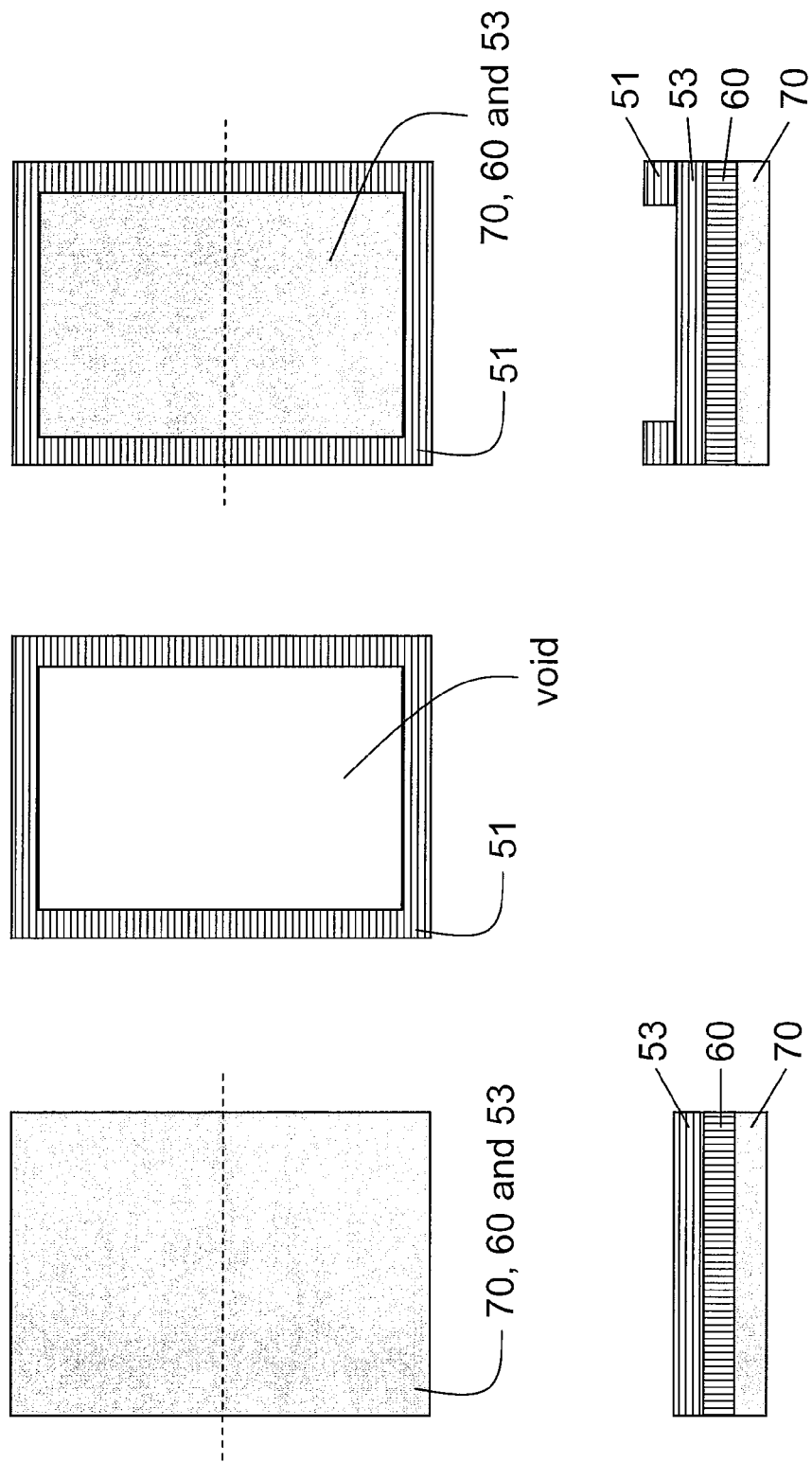

ically to

ATTACHMENT SYSTEM OF PHOTOVOLTAIC CELL TO FLUOROPOLYMER STRUCTURAL MEMBRANE

CROSS REFERENCE TO RELATED APPLICATIONS

This application claims benefit of U.S. Ser. No. 61/153,786, filed on Feb. 19, 2009, and U.S. Ser. No. 61/231,184, filed Aug. 4, 2009, the contents of which are incorporated in their entirety herein by reference.

FIELD OF THE INVENTION

The invention generally relates to an extensible architectural membrane system to which a photovoltaic device is removably attached via hook and loop fabric, or equivalent thereof.

BACKGROUND OF THE INVENTION

Photovoltaic devices, also referred to as solar cells or solar modules, can be affixed to the rooftop of building structures. These devices convert light energy from the sun into electricity that may be used or stored for later use. Many buildings have roofs that may be desirable for solar cell or solar module placement.

Traditionally, installation of photovoltaic systems involves attaching the device to a roof with mechanical fasteners such as bolts or screws. While this can be effective to secure the devices, damage to the roof can occur during installation. For example, the holes may leak, the holes may be the source of other eventual failures such as tearing or cracking and/or the installation of screws or bolts can be time consuming and require precise measurement and drilling of fastener holes. Perhaps more importantly, mechanical fasteners are relatively permanent, and the photovoltaic devices may not be easily moved or removed without leaving damaged roof sections.

Such issues with securing the photovoltaic device to a roof is exacerbated where the roof is of "tensioned" or air supported type construction. Architectural membranes are used in tension or air supported type construction, where the membrane is stretched (placed under tension) across supporting members. Securing a photovoltaic device by screws or fasteners to such an architectural membrane would either lead to complete failure of the membrane by tearing, or at the very least, provide holes that would permit leakage.

Therefore, a need exists for ways to secure photovoltaic devices to architectural membranes that do not compromise the water resistant properties thereof and that are integrated into the roofing system.

BRIEF SUMMARY OF THE INVENTION

The present invention surprisingly provides a photovoltaic device/architectural membrane system that advantageously has extensible properties, such that the system has the ability to elongate/extend/shrink/deform without damage to the photovoltaic device. In one aspect, it can be understood that the underlying architectural membrane has physical attributes to conform to given atmospheric conditions (heat, cold, rain, show, wind, etc.) whereas the photovoltaic device generally is less flexible. However, by the unique construction of the system, the architectural membrane can conform to the changes while the photovoltaic device remains relatively non-extensible. As a metaphor, it can be thought of similarly to earthquake resistant building in California, where the building is supported on a series of rollers/springs that absorb deformations due to an earthquake, while the remainder of the building does not need to conform. Similarly, the underlying architectural membrane system can adapt to weather related conditions, while the photovoltaic device is not required to do so.

The system includes a first layer that is a combination of fluoropolymer encapsulated reinforcement with a first bondable layer disposed on a second side of the first layer; a second layer, that is a combination of a fluoropolymer encapsulated reinforcement such that a first side provides an unencapsulated reinforcement surface and a second side has a second bondable layer disposed thereupon, such that the second side of the second layer and the second side of the first layer are bonded; a third layer, comprising an adhesive disposed upon the unencapsulated reinforcement surface of the second layer; a fourth layer that is a hook and loop fastener disposed upon the third layer; a fifth layer, comprising an adhesive disposed upon the fourth layer; and the photovoltaic device disposed upon the fifth layer.

Typically, the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

The reinforcement of the first layer is generally a high temperature resistant fibers, such as glass, polyaramid, polyester, carbon or metal fibers as a fabric, mesh, or nonwoven material.

In one aspect, the first bondable layer is a PFA, THV, PVDF, ETFE or an FEP. The first bondable layer can be on both the first and second sides.

In another aspect, the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

In another embodiment, the reinforcement of the second layer comprises a glass, polyaramid, polyester, carbon fiber or metal fiber as a fabric, a mesh, or nonwoven material. The second layer is "sided"; one side of the reinforcement remains unencapsulated by the fluoropolymer.

In still another embodiment, the second bondable layer of the second layer is a PFA, THV, ETFE, PVDF or an FEP. This is found on the fluoropolymer portion of the second layer.

In still yet another embodiment, the unencapsulated reinforcement surface of the second layer is in contact with the third layer; an adhesive layer. Exemplary adhesives include, for example, a neoprene rubber, a two part epoxy, butyl rubber, or a polyurethane adhesive.

In still another embodiment, the fourth layer is a hook and loop fastener disposed upon the third adhesive layer.

In another aspect, the fifth layer, comprising an adhesive is disposed upon the fourth layer and the photovoltaic device disposed upon the fifth layer.

Alternatively, the hook and loop fastener can have one or both adhesive layer(s) disposed onto the hook and look fastener. In yet another alternative embodiment, the photovoltaic device can have an adhesive layer disposed upon the outer surface to adhere to a portion of the hook and loop fastener.

An optional bondable layer between the first bondable layer and second bondable layer can also be applied.

As noted above, by inclusion of the layers of the system described herein, the system itself is flexible enough to withstand physical changes due to wind, rain, snow, heat, cold, etc. The construction is unique where, for example, the fluoropolymer/reinforcement layer, the bondable layer, and/or the adhesive all provide extensibility for the ultimate construct.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed descriptions are to be regarded as illustrative in nature and not restrictive.

BRIEF DESCRIPTION OF THE DRAWINGS

FIG. 4 depicts the embodiment of FIG. 3 wherein a frame is positioned about the perimeter of a photovoltaic device and is constructed by the use of a hook and loop system or flexible material to secure the photovoltaic device to a substrate.

DETAILED DESCRIPTION

Figure 1:
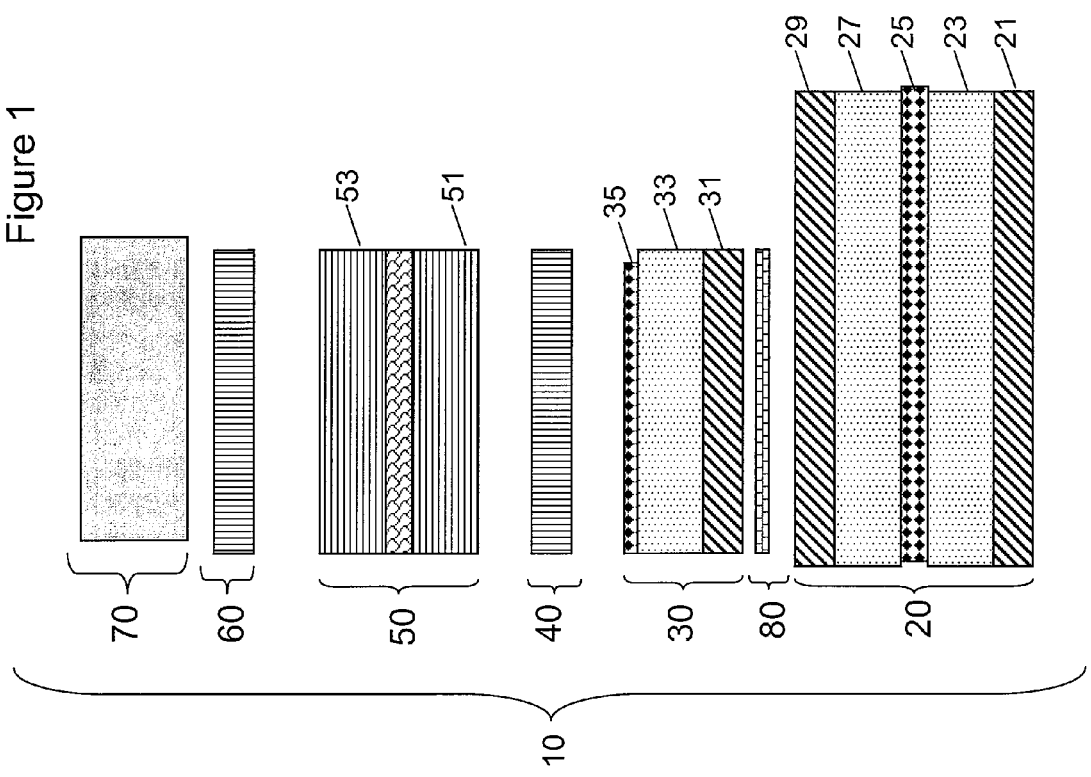
FIG. 1 provides an embodiment of the invention.

In the specification and in the claims, the terms "including" and "comprising" are open-ended terms and should be interpreted to mean "including, but not limited to . . . ." These terms encompass the more restrictive terms "consisting essentially of" and "consisting of."

It must be noted that as used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

Unless defined otherwise, all technical and scientific terms used herein have the same meanings as commonly understood by one of ordinary skill in the art to which this invention belongs. All publications and patents specifically mentioned herein are incorporated by reference in their entirety for all purposes including describing and disclosing the chemicals, instruments, statistical analyses and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

In one aspect, the present invention surprisingly provides a system to tether a photovoltaic device to a tensioned or air supported architectural membrane structure by use of a hook and loop engageable/disengageable fastener system. One advantage of the system is the ability to remove and replace photovoltaic components from the system without the damage to the underlying support. Therefore, when a photovoltaic component is damaged, is worn out, requires maintenance, etc., the component can simply be removed and either replaced or repaired and reattached without the need to reattached by fasteners or screws as more traditional systems. It should be understood that another advantage is that the photovoltaic component is securely fastened to the system, such that it can withstand wind, rain, snow, heat, cold, etc. while still accommodating the flexing and elongation of the membrane. The hook and loop fastener system provides the ability to change/replace the device while still providing a strong enough engagement that the elements do not cause the component to be easily separated from the system.

The phrase "photovoltaic device" include photovoltaic cells, solar cells or modules comprising crystalline silicon, a-silicon (amorphous silicon); CIGS (Copper Indium Gallium diSelenide); DSSC (Dye Sensitized Solar Cell); OPV (Organic Photovoltaic); CdTe (Cadmium Telluride) GdAs (Gallium Arsenide) or, for example, a Unisolar PVL-136 laminate and the like. The photovoltaic construction can be rigid such as crystalline silicon with a glass front surface or flexible, such as thin film amorphous silicon with an ETFE front surface.

The phrase "architectural membrane" is known in the art and is intended to include structural elements, more specifically to "fabric structures" also referred to herein as "architectural membrane structures", "architectural structures" or simply as "structures" or "composites", the last two terms being used interchangeably. Examples include tents, awnings, canopies, shaded parking structures, stadiums, amphitheaters, airports and the like.

In some aspects the structure is a tensioned or tensile structure which typically carries tension stress only, without compression or bending. In specific examples, the structure disclosed herein meets a proposed Industry Standard for carrying tension or shear only in the plane of the membrane.

The phrase "fluoropolymer" is known in the art and is intended to include, for example, polytetrafluoroethylene, copolymers of tetrafluoroethylene and hexafluoropropylene, tetrafluoroethylene-perfluoro(alkyl vinyl ether) copolymers (e.g., tetrafluoroethylene-perfluoro(propyl vinyl ether), FEP (fluorinated ethylene propylene copolymers), polyvinyl fluoride, polyvinylidene fluoride, and copolymers of vinyl fluoride, chlorotrifluoroethylene, and/or vinylidene difluoride (i.e., VDF) with one or more ethylenically unsaturated monomers such as alkenes (e.g., ethylene, propylene, butylene, and 1-octene), chloroalkenes (e.g., vinyl chloride and tetrachloroethylene), chlorofluoroalkenes (e.g., chlorotrifluoroethylene), fluoroalkenes (e.g., trifluoroethylene, tetrafluoroethylene (i.e., TFE), 1-hydropentafluoropropene, 2-hydropentafluoropropene, hexafluoropropylene (i.e. HFP), and vinyl fluoride), perfluoroalkoxyalkyl vinyl ethers (e.g., $CF_3OCF_2CF_2CF_2OCF=CF_2$); perfluoroalkyl vinyl ethers (e.g., $CF_3OCF=CF_2$ and $CF_3C_2CF_2OCF=CF_2$), and combinations thereof.

The fluoropolymer can be melt-processable, for example, as in the case of polyvinylidene fluoride; copolymers of vinylidene fluoride; copolymers of tetrafluoroethylene, hexafluoropropylene, and vinylidene fluoride copolymers of tetrafluoroethylene and hexafluoropropylene; copolymers of ethylene and tetrafluoroethylene and other melt-processable fluoroplastics; or the fluoropolymer may not be melt-processable, for example, as in the case of polytetrafluoroethylene, copolymers of TFE and low levels of fluorinated vinyl ethers, and cured fluoroelastomers.

Useful fluoropolymers include copolymers of HFP, TFE, and VDF (i.e., THV). Examples of THV polymers include those marketed by Dyneon, LLC under the trade designations "DYNEON THV".

Other useful fluoropolymers also include copolymers of ethylene, TFE, and HFP. Such polymers are marketed, for example, under the trade designation "DYNEON FLUOROTHERMOPLASTIC HTE" by Dyneon, LLC.

Additional commercially available vinylidene fluoride-containing fluoropolymers include, for example, those fluoropolymers having the trade designations; "KYNAR" (e.g., "KYNAR 740") as marketed by Arkema, Philadelphia, Pa.; "HYLAR" (e.g., "HYLAR 700") and "SOLEF" as marketed by Solvay Solexis USA, West Deptford, N.J.; and "DYNEON PVDF Fluoroplastics" such as DYNEON FP 109/0001 as marketed by Dyneon, LLC; Copolymers of vinylidene difluoride and hexafluoropropylene are also useful. These include for example KYNARFLEX (e.g. KYNARFLEX 2800 or KYNARFLEX 2550) as marketed by Arkema.

Commercially available vinyl fluoride fluoropolymers include, for example, those homopolymers of vinyl fluoride marketed under the trade designation "TEDLAR" by E.I. du Pont de Nemours & Company, Wilmington, Del.

Useful fluoropolymers also include copolymers of tetrafluoroethylene and propylene (TFE/P). Such polymers are commercially available, for example, under the trade designations "AFLAS as marketed by AGC Chemicals America, or "VITON" as marketed by E.I. du Pont de Nemours & Company, Wilmington, Del.

Useful fluoropolymers also include copolymers of ethylene and TFE (i.e., "ETFE"). Such polymers may be obtained commercially, for example, as marketed under the trade designations "DYNEON FLUOROTHERMOPLASTIC ET 6210A", "DYNEON FLUOROTHERMOPLASTIC ET 6235", or by Dyneon, LLC, or under the trade designation "NEOFLON ETFE" from Daikin America Inc (e.g. NEOFLON ETFE EP521, EP541, EP543, EP6100R EP620), or under the trade designation "TEFZEL" from E.I. du Pont de Nemours & Company, Wilmington, Del.

Additionally, useful fluoropolymers include copolymers of ethylene and chlorotrifluoroethylene (ECTFE). Commercial examples include Halar 350 and Halar 500 resin from Solvay Solexis Corp.

Other useful fluoropolymers include substantially homopolymers of chlorotrifluoroethylene (PCTFE) such as Aclar from Honeywell.

Modified fluoropolymers, a subgroup of fluoropolymers in general, are also useful. Suitable functional groups attached in modified (functionalized) fluoropolymers are carboxylic acid groups such as maleic or succinic anhydride (hydrolyzed to carboxylic acid groups), carbonates, epoxy, acrylate and its derivative such as methacrylate, phosphoric acid and sulfonic acid. Commercially available modified fluoropolymers include Fluon® LM-ETFE AH from Asahi, Neoflon® EFEP RP5000 and Neoflon® ETFE EP7000 from Daikin and Tefzel®HT2202 from DuPont.

Fluoropolymeric substrates may be provided in any form (e.g., film, tape, sheet, web, beads, particles, or as a molded or shaped article) as long as the fluoropolymer can be processed.

Fluoropolymers are generally selected as outer layers to provide chemical resistance, electrical insulation, weatherability and/or a barrier to moisture.

The term "encapsulated" is intended to mean that the reinforcement material is covered with a fluoropolymer. The coating does not necessarily need to be uniform in coverage or thickness but generally coats the fibers or the reinforcement. The encapsulating material can be dipped, sprayed, painted, vapor deposited, laminated etc. onto the reinforcement. Additionally, the encapsulant, e.g., the fluoropolymer, can be sintered at elevated temperatures.

For example, an encapsulated reinforcement construct can be formed by coating or impregnating a reinforcement substrate, e.g. fiberglass, with PTFE or the like in known manner, for example, by applying the PTFE from a suspension and fusing the applied PTFE, for example in accordance with the teachings of U.S. Pat. No. 3,928,703 to Cook.

Encapsulated reinforcement constructs are known in the art and can be prepared by the methods described in Non-melt Processible Fluoroplastics: The Definitive User's Guide and Databook, Sina Ebnesajjad, 2000, Plastics Design Library, Norwich, N.Y., the contents of which are incorporated herein by reference. See for example, page 175 through 178. Briefly, a fiberglass fabric is passed through a fluoropolymer dispersion. Excess material is removed from the fabric and the materials are dried. This process can be repeated multiple times and then the composite can be subjected to baking, calendering and/or sintering.

For example, a woven fiberglass fabric can be heat-cleaned to minimize residual sizing. A coating can be applied by dipping the substrate in an aqueous dispersion of PTFE (TE3879 obtained from Dupont and applied at 53% solids). The coating is then dried and sintered in a single or multi-zone coating tower with drying temperatures of 350° F. and sintering zone temperatures 680° F.

The construct can be finished with a bondable layer topcoat using, for example, an FEP dispersion (TE-9568 obtained from DuPont and applied at 38% solids). The topcoat can be applied by dipping, drying and sintering in a single or multi-zone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having enhanced resistant to environmental effects.

Suitable examples of encapsulated reinforcement constructs include architectural membranes. Encapsulated reinforcements include those prepared from fiberglass substrates encapsulated with PTFE which is subsequently sintered. Examples include SHEERFILL® products by Saint-Gobain Performance Plastics Corporation (Merrimack, N.H.), such as SHEERFILL® IIA, I-HT, II-HT, IVA or V, DURASKIN (Verseidag, Germany), SKYTOP (Chukoh, Japan) or SOLUS (Taconic, South Korea).

The term "reinforcement" is recognized in the art and is intended to include materials that are fabrics, wovens, nonwovens, lay downs, meshes and the like. Suitable reinforcement materials include, for example, glass, fiberglass, aramids, polyesters, polyamides, carbon fibers, metal fibers, halopolymers and the like.

Any suitable textile material capable of withstanding processing temperatures and able to sustain the static and dynamic mechanical loads in a structure may be employed as the reinforcing material in accordance with the present invention. Examples include, inter alia, fiberglass, ceramics, graphite (carbon), PBI (polybenzimidazol), polyaramides such as KEVLAR and NOMEX, polyesters such as REEMAY, polyamides, polyimides, thermoplastics such as TEFZEL (ETFE), polyethersulfones, polyetherimides, polyetherketones, novoloid phenolic fibers such as KYNOL, PTFE, cotton, and other natural and synthetic fibers. The reinforcing material may comprise a yarn filament, monofilament, slit film or the like assembled as a textile. The reinforcing material also may comprise a metallic material such as steel wire or mesh or the like. In one aspect, the reinforcing material comprises fiberglass In particular, materials that can withstand processing temperatures of at least 360° C. are desirable.

The phrase "bondable layer" is intended to encompass two types of materials. In one aspect, the bondable layer is a layer that has similar characteristics to the fluoropolymer material but is adapted to provide adhesive characteristics for the adhesion to another material, such as another fluoropolymer. Suitable bondable materials include, for example, PFA, PVDF, ETFE, THV or FEP.

In another aspect, alternatively, or in combination with a bondable layer, the fluoropolymer of the first layer (and/or second layer) can be surface treated. Generally, hydrophilic functionalities are attached to the fluoropolymer surface, rendering it easier to wet and provides opportunities for chemical bonding. There are several methods to functionalize a fluoropolymer surface including plasma etch, corona treatment, chemical vapor deposition, or any combination thereof. In another embodiment, plasma etching includes reactive plasmas such as hydrogen, oxygen, acetylene, methane, and mixtures thereof with nitrogen, argon, and helium. Corona treatment can be conducted in the presence of reactive hydrocarbon vapors such as ketones, e.g., acetone, C1-C4 carbon chain length alcohols, p-chlorostyrene, acrylonitrile, propylene diamine, anhydrous ammonia, styrene sulfonic acid, carbon tetrachloride, tetraethylene pentamine, cyclohexyl amine, tetra isopropyl titanate, decyl amine, tetrahydrofuran, diethylene triamine, tertiary butyl amine, ethylene diamine, toluene-2,4-diisocyanate, glycidyl methacrylate, triethylene tetramine, hexane, triethyl amine, methyl alcohol, vinyl acetate, methylisopropyl amine, vinyl butyl ether, methyl methacrylate, 2-vinyl pyrrolidone, methylvinylketone, xylene or mixtures thereof.

Some techniques use a combination of steps including one of these methods. For example, surface activation can be accomplished by plasma or corona in the presence of an excited gas species. For example c-treatment refers to a method for modifying the surface by corona treatment in the presence of a solvent gas such as acetone or a C1-C4 carbon chain length alcohol.

Not to be limited by theory, the method has been found to provide strong interlayer adhesion between a modified fluoropolymer and a non fluoropolymer interface (or a second modified fluoropolymer). In one way, a fluoropolymer and a non fluoropolymer shape are each formed separately. Subsequently, the fluoropolymer shape is surface treated by the treatment process described in U.S. Pat. Nos. 3,030,290; 3,255,099; 3,274,089; 3,274,090; 3,274,091; 3,275,540; 3,284,331; 3,291,712; 3,296,011; 3,391,314; 3,397,132; 3,485,734; 3,507,763; 3,676,181; 4,549,921; and 6,726,979, the teachings of which are incorporated herein in their entirety for all purposes. Then, the resultant modified fluoropolymer and non fluoropolymer shapes are contacted together for example by heat lamination to form a multilayer film. Additionally, the multilayer film can be submitted to a UV radiation with wavelengths in the UVA; UVB and/or UVC range.

In one aspect, the surface of the fluoropolymer substrate is treated with a corona discharge where the electrode area was flooded with acetone, a C1-C4 carbon chain length alcohol, tetrahydrofuran methyl ethyl ketone, ethyl acetate, isopropyl acetate or propyl acetate vapors.

Corona discharge is produced by capacitative exchange of a gaseous medium which is present between two spaced electrodes, at least one of which is insulated from the gaseous medium by a dielectric barrier. Corona discharge is somewhat limited in origin to alternating currents because of its capacitative nature. It is a high voltage, low current phenomenon with voltages being typically measured in kilovolts and currents being typically measured in milliamperes. Corona discharges may be maintained over wide ranges of pressure and frequency. Pressures of from 0.2 to 10 atmospheres generally define the limits of corona discharge operation and atmospheric pressures generally are desirable. Frequencies ranging from 20 Hz to 100 kHz can conveniently be used: in particular ranges are from 500 Hz, especially 3000 Hz to 10 kHz.

All details concerning the corona discharge treatment procedure are provided in a series of U.S. patents assigned to E. I. du Pont de Nemours and Company, USA, described in expired U.S. Pat. No. 3,676,181, and Saint-Gobain Performance Plastics Corporation U.S. Pat. No. 6,726,979, the teachings of which are incorporated herein in their entirety for all purposes. An example of the proposed technique may be found in U.S. Pat. No. 3,676,181 (Kowalski).

In another aspect, the surface of the fluoropolymer is treated with a plasma. The phrase "plasma enhanced chemical vapor deposition" (PECVD) is known in the art and refers to a process that deposits thin films from a gas state (vapor) to a solid state on a substrate. There are some chemical reactions involved in the process, which occur after creation of a plasma of the reacting gases. The plasma is generally created by RF (AC) frequency or DC discharge between two electrodes where in between the substrate is placed and the space is filled with the reacting gases. A plasma is any gas in which a significant percentage of the atoms or molecules are ionized, resulting in reactive ions, electrons, radicals and UV radiation.

The term "unencapsulated" is intended to mean a portion or surface of reinforcement that is not coated, treated, or otherwise in contact with a fluoropolymer, e.g., the surface is unmodified or virgin.

Therefore, the second layer of the photovoltaic/architectural membrane construct is "sided"; that is, one side of the reinforcement includes a fluoropolymer and the other side of the reinforcement does not include a fluoropolymer and is unencapsulated. This unmodified surface can then be further treated. Suitable examples of one "sided" reinforcements include microwave transmissive composite materials.

For example, the application of the fluoropolymer dispersion can be carefully controlled and localized at the surface of the reinforcement, with penetration being adequate to achieve the desired bond. One method to achieve this is by kiss roll coating in which a roll transfers coating to the fabric by touching or "licking" the surface to apply coating to only one side of the fabric. Another method is a combination of kiss coating followed by pour coating. The kiss coating limits coating application to one side and pour coating can then be used to build up additional coating thickness.

Penetration depths of the dispersion should be controlled so that no obvious liquid penetration, or "bleed through" occurs to the other side. There should be no visible resin on the uncoated side of the fabric. Penetration depth should not generally exceed 50% of the overall reinforcement thickness.

The elimination of bleed through of the fluoropolymer dispersion is dependent on a number of factors, including the density of the reinforcement, the viscosity of the dispersion, the specific gravity of the dispersion, the coating method and its corresponding parameters such as coating time, etc.

A fluoropolymer dispersion can be chosen based on the characteristics required to produce the desired product. The specific dispersion selected has sufficient penetration to create an adequate bond between the reinforcement and its associated component. Dispersions having a wide range of viscosities can be utilized dependent on the thickness and porosity of the reinforcement, the desired weight of the finished product, the stiffness of the finished product, etc.

The specific gravity of the fluoropolymer dispersion also affects the coating properties. The specific gravity of the dispersion should be in the range of between 1.05 and 1.5, more particularly at least 1.35. Coating weights should be about 0.5 oz/sq yd and less than 32 oz/sq yd.

Fluoropolymers useful in the present invention can be selected from those known to those skilled in the art, as described for example in U.S. Pat. No. 4,770,927 (Effenberger et al.), the disclosure of which is herein incorporated by reference in its entirely.

Commercially available fluoropolymer products useful with the present invention include the following perfluoroplastics:

PTFE: such as Daikin Polyflon; Dupont Teflon; ICI Fluon; Ausimont Algoflon;

FEP: such as Daikin Neoflon; Dupont Teflon;

PFA: such as Daikin Neoflon; Dupont Teflon; Ausimont Hyflon;

MFA: such as Ausimont Hyflon;

Fluoroelastomers: such as Dupont Viton; 3M Fluorel; Ausimont Tecnoflon; Daikin Daiel; Asahi Glass Aflas; and/or Perfluoroelastomers: such as Dupont Kalrez; DaikinPerfluor.

The fluoropolymers can also include fillers, pigments and other additives, examples of which include titanium dioxide, talc, graphite, carbon black, cadmium pigments, glass, metal powders and flakes, and other high temperature materials such as sand, fly ash, etc.

The reinforcement layers can be coated by the fluoropolymer by various techniques employing vertical coating towers, spray coaters, reverse roll coaters, roller coaters, horizontal coaters with doctor blades, kiss roll coating or other methods known in the art.

The construct can be finished with a bondable layer topcoat using, for example, an FEP dispersion (TE-9568 obtained from DuPont and applied at 38% solids). The topcoat can be applied by dipping, drying and sintering in a single or multi-zone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having enhanced resistant to environmental effects.

Examples of the second layer (the sided layer) include those manufactured by Saint-Gobain Performance Plastics Corporation (Merrimack, N.H.) such as RAYDEL® materials, e.g., M15-OS and M26-OS which are fiberglass single side coated with PTFE.

The term "adhesive" is known in the art and includes various materials that can adhere two surfaces to each other. Suitable adhesives include, for example, a neoprene rubber, a two part epoxy, butyl rubber, or a polyurethane adhesive.

The phrase "hook and loop" engageable fastener system is intended to include those materials that are also referred to as "flexible touch fastener", "fastener with securing loops", "loop engageable fastener", "intermeshing closure", "burr fasteners" and are flexible intermeshing closures that adhere to each other when brought into contact. Such fastener systems are commercially available from VELCRO® (Velcro, Manchester N.H.), Minnesota Manufacturing & Mining Co. (3M SCOTCHMATE™), and DURAGRIP™. The general construction of the fastener system is comprised of a soft fuzzy material (Loop) side and a rougher (Hook) side. When pushed together, hundreds of tiny hooks engage the loops to form a strong fastener. Alternatively, there are systems that have a male/female design where the male "lollipop" fits securely into a corresponding female site where the lollipop is engaged by the female portion.

In one embodiment, the material is VELCRO® hook material model 752 and VELCRO® loop material model 3001.

Referring now to FIG. 1, one embodiment of the invention is provided as an exemplary construct photovoltaic device/architectural membrane system 10. The system 10 generally includes a first layer 20, second layer 30, third layer 40, fourth layer 50, fifth layer 60 and a photovoltaic device 70. An optional bondable layer 80 can be included.

First layer 20 generally includes an optional bondable layer 21, a fluoropolymer layer 23, a reinforcement layer 25, a fluoropolymer layer 27 and a bondable layer 29 as described herein. In particular, the fluoropolymer layers 23 and 27 are essentially sintered PTFE, the reinforcement layer 25 is fiberglass and the bondable layers 21 and 29 are PFA or FEP.

Second layer 30 generally includes a bondable layer 31, a fluoropolymer layer 33 and a reinforcement layer 35. In one embodiment, the bondable layer 31 is PFA or FEP, the fluoropolymer 33 is essentially sintered PTFE and the reinforcement layer 35 is fiberglass. It should be understood that layer 30 can be sided, in that one side of the reinforcement remains unencapsulated by the fluoropolymer.

Third layer, 40, is generally a polyurethane adhesive (e.g., Bemis hot melt 3218, 5 mil film type), neoprene rubber (e.g., Bostik 1096M with a 9RX curing agent), butyl rubber adhesive (e.g., Heliobond PVA 600BT) or a two part epoxy (e.g., Scotch-Weld 1400DP).

Fourth layer, 50, is a loop (51) and hook (53) (or vice versa) construct that is adhered to the adhesive. In one embodiment, the loop material (51), being less expensive than the hook material (53), is attached to the underside of the photovoltaic device 70, and the hook material (53) is attached to third layer 40, adjacent to second layer 30. In another embodiment, the hook material (53) is thermally bonded directly to the underside of the photovoltaic device 70 during construction so as to eliminate the need for an adhesive layer between the hook material and the underside of 70.

Fifth layer, 60, is generally a polyurethane adhesive (e.g., Bemis hot melt 3218, 5 mil film type), neoprene rubber (e.g., Bostik 1096M with a 9RX curing agent), butyl rubber adhesive (e.g., Heliobond PVA 600BT) or a two part epoxy (e.g., Scotch-Weld 1400DP).

The photovoltaic device, 70, can be any suitable photovoltaic cell, solar cell, crystalline silicon, amorphous silicon, CIGS, CIS, CdTe, DSSC, OPV or, for example, a Unisolar PVL-136 laminate and the like. The photovoltaic construction can be rigid such as crystalline silicon with a glass front surface or flexible, such as thin film amorphous silicon with an ETFE front surface.

Optional bondable layer 80 can be included and can be, for example, PFA, ETFE, PVDF, THV or FEP.

Referring again to FIG. 1, another embodiment employs a "flexible" substrate in place of the hook and loop assembly of the fourth layer 50. Flexible substrate 50 could be any material that moves in the x, y and z planes. The material can stretch and flex with the movement of the assembly due to environmental effects such as heat, cold and wind. Suitable materials include, for example, foams, such as closed cell foams.

Examples of foams include, but are not limited to, polyurethane foams, acrylic foams, PVC foams, polyethylene foams, neoprene foams, EPDM foams, styrenic foams, ABS foams, SANTOPRENE foams, NORPRENE foams and rubber foams (both natural and synthetic).

Additional adhesives that can be used with foams, as in bonding layers 40 and 60, in addition to those listed above, include acrylic adhesives, silicone adhesives, epoxy adhesives and elastomeric adhesives, especially penetrating elastomeric sealants. Suitable penetrating elastomeric sealants include those described in U.S. Patent Publication Nos. 2008/0221232 and 2009/0162664, the contents of which are incorporated herein by reference.

In another embodiment, the second layer 30 (in particular reinforcement layer 35) and the hook and loop assembly of fourth layer 50 can be modified in such ways that that an adhesive (e.g., 40) is not required to adhere 50 to 30. For example, the hook and loop assembly 50 can be joined directly to second layer 30 (e.g., reinforcement layer 35) by heat sealing. In one aspect, hook 51 and loop 53 assembly and the backing material could be of a low melting fluoropolymer so as to be heat sealable. These materials include for example polyvinylidene difluoride, (PVDF) and copolymers of HFP, TFE and VDF (i.e. THV.) In another aspect, reinforcement layer 35 could be coated with a heat sealable material, such that the hook 51 and loop 53 assembly (and/or backing material) could be heat sealed to 30. In another aspect, reinforcement layer 35 could be coated with material selected such that hook structure 51 could be directly embedded in layer 35. In yet another aspect, fourth layer 50 could be coated with KYNAR and then heat sealed to 35 which is also treated with KYNAR. In still another embodiment, the backing material of hook 51 and loop 53 portions can extend beyond the assembly to form "wings". The wings can be heat sealed to reinforcement layer 35 (which can be coated as well with KYNAR).

In still another embodiment, photovoltaic device 70 can be adhered directly to fourth layer 50, whether it be a hook and loop assembly or foam. This can be accomplished where the back sheet of 70 is heat sealable fourth layer 50. Suitable back sheet materials include, for example, PVDF, FEP, PFA, ETFE, polyolefins and or polyesters. Therefore, third layer 40 and fifth layer 60 can be optional in suitable constructs where heat bondable/heat sealable materials are selected.

In still another embodiment flexible substrate 50 may be a flexible elastomeric sealant layer. This can include materials capable of stretching and flexing with the PV. The elastomeric sealant layer may be incorporated as a separate layer 50 and bonded to the layer 30 and 70 by adhesives in layer 40 and/or layer 60. Suitable adhesives include those listed previously. The flexible elastomeric sealant layer can also be adhered directly to layer 30 and/or layer 70 if it has sufficient adhesive quality. Penetrating elastomeric sealants, and penetrating elastomeric curing sealants are particularly preferred.

In another aspect, based on FIG. 1, fourth layer 50 can be a "zipper" assembly, where 51 can be teeth of the zipper and 53 can also be the teeth of the zipper (or vice versa) (Slider to join the teeth together not shown.). The zipper assembly can be adhered to the subsequent layers as described herein. The zipper assembly can be secured about the dimensions of the circumference of the photovoltaic device 70.

Figure 2:
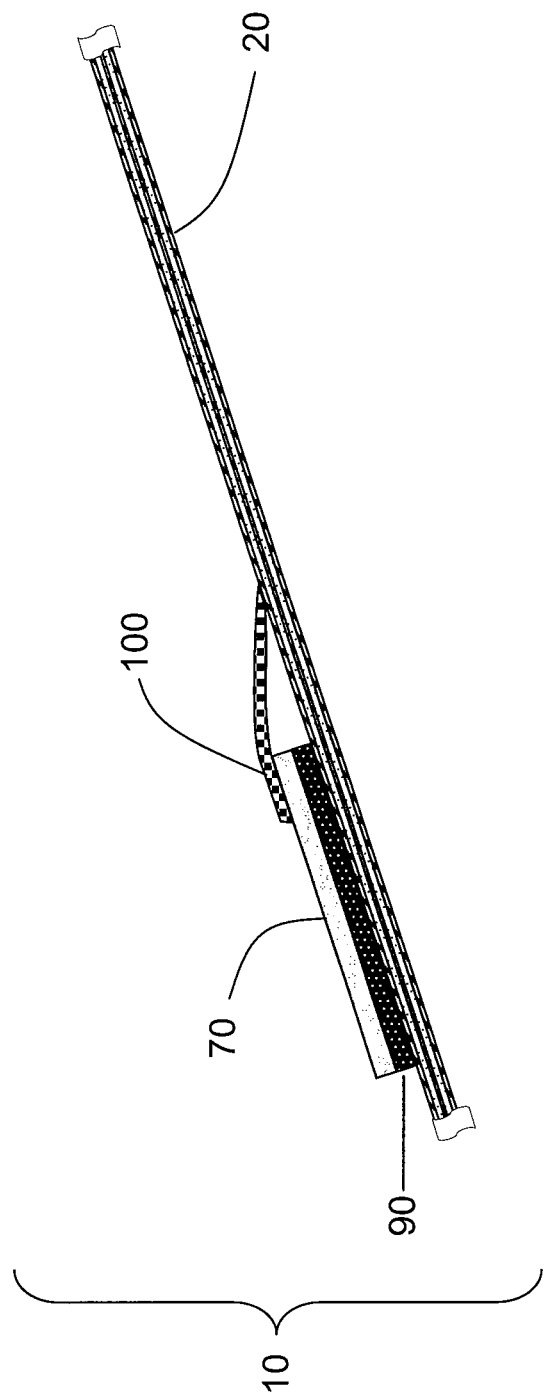
FIG. 2 provides another embodiment of the invention.

FIG. 2 provides another embodiment of the invention. Device/architectural membrane system 10 which includes a photovoltaic device 70 that is adhered to encapsulated reinforcement construct 20 and can include an adhesive or flexible layer 90 with a "flap" 100 which helps protect photovoltaic device 70 from water, snow, ice, debris, etc. The flap provides a low profile, allowing snow and ice to easily pass over the PV edge without damage to the device. It should be understood that layer 90 can be any of the attachment methods described above, including adhesives, flexible substrates such as foams or hook and loop systems.

The construct 20 can be of a heat bondable material including PVDF or other suitable fluoropolymers described herein.

Flap 100 is also a heat bondable material such that 100 and 20 can be heat bonded to each other.

Combinations of various bonding/adhesion methods described herein are contemplated and included as part of the present invention.

It should be understood that each "layer" can be a strip, a circular attachment, a square attachment, oblong etc. etc. The layer does not need to be continuous or unitary in nature but sufficient to provide enough contact surface to the adjacent layer to accomplish the purpose of the layer.

Film thicknesses are set forth herein in terms of "mils", wherein one mil is equal to 0.001 inch.

All necessary layers of the system described herein can be fully assembled prior to on site installation to the architectural membrane (20). This is generally only possible if the expected elongation of the membrane during its positioning or installation will be less than about 3%. More commonly architectural membranes experience significantly greater than 3% elongation during installation. Therefore, one embodiment of the invention is to have the bottom half of the construction (below the hook and loop separation line) pre-joined to the architectural membrane, and the upper half of the construction (above the hook and loop separation line) pre-joined to the photovoltaic device. The photovoltaic device containing half is then joined to the membrane after the structure is fully tensioned in place. The lower half hook and loop anchoring layer can be appropriately sized and placed to adjust for dimensional changes that may occur during installation while still providing for final anchoring of the upper half containing the photovoltaic device.

Alternatively, the system can be installed on site. For example, referring to FIG. 1, the architectural membrane 20 (optionally with layer 21) can be on an existing structure or can be new construction. The second layer 30 can then be heat bonded, for example, to the architectural membrane 20 on site after the membrane has been positioned/tensioned as desired. Adhesive layer 40 can be applied on site or can be preapplied to 30 for convenience. The hook and loop construct 50 can then be added with or without the photovoltaic device 70 and bonding layer 60. Again, it should be understood that the photovoltaic device 70 can include bonding layer 60 or the hook and loop construct can be applied on either or both sides with bonding layers 40 and 60. Thus the present invention provides the advantage that the components of the system can be packaged in a manner that is useful for the construction project.

One additional advantage is that if for any reason the system is no longer desired, layers 30 through 80 can be removed, thus leaving only the architectural membrane 20.

Figure 3:
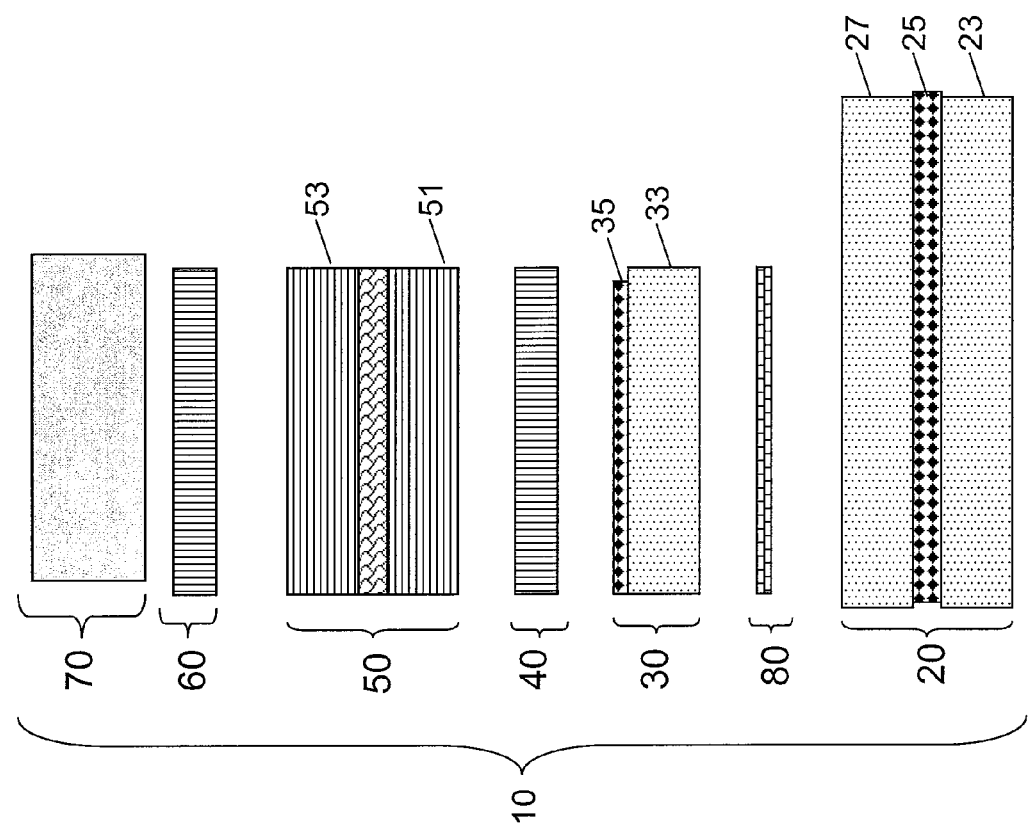
FIG. 3 is still another embodiment of the invention.

FIG. 3 provides another embodiment of the photovoltaic device/architectural membrane system 10 of the present invention and is a variation of FIG. 1. First layer 20 generally includes a fluoropolymer layer 23, a reinforcement layer 25 and a fluoropolymer layer 27 such as in SHEERFILL. In particular, the fluoropolymer layers 23 and 27 are essentially sintered PTFE, the reinforcement layer 25 is fiberglass.

Bondable layer 80 can be, for example, PFA, ETFE, PVDF, THV or FEP.

Second layer 30 generally includes a fluoropolymer layer 33 and a reinforcement layer 35. In one embodiment, the fluoropolymer 33 is essentially sintered PTFE and the reinforcement layer 35 is fiberglass. It should be understood that layer 30 is sided, in that one side of the reinforcement remains unencapsulated by the fluoropolymer.

Third layer, 40, is generally a polyurethane adhesive (e.g., Bemis hot melt 3218, 5 mil film type), neoprene rubber (e.g., Bostik 1096M with a 9RX curing agent), butyl rubber adhesive (e.g., Heliobond PVA 600BT) or a two part epoxy (e.g., Scotch-Weld 1400DP).

Fourth layer, 50, is a hook (51) and loop (53) (or vice versa) construct or a flexible substrate as described above, and can be any material that moves in the x, y and z planes.

Fifth layer, 60, is generally a polyurethane adhesive (e.g., Bemis hot melt 3218, 5 mil film type), neoprene rubber (e.g., Bostik 1096M with a 9RX curing agent), butyl rubber adhesive or a two part epoxy (e.g., Scotch-Weld 1400DP).

The photovoltaic device, 70, can be as described above.

FIG. 4 provides an exemplary depiction of a "framed" system as described herein and is applicable to all constructs described throughout.

As shown in FIG. 4, device/architectural membrane system 10 can be assembled by adhering photovoltaic device 70 to loop 53 (or flexible substrate) with fifth layer 60. The assembly can be formed to any shape and size, although square or rectangular shapes are particularly well suited for construction. However, the assembly can be circular, octagonal, trapezoidal, etc. It should also be understood that loop 53 (or flexible substrate material, etc.) can cover the entire surface of device 70 or only a portion thereof, such that ultimately the adhesive forces between layers maintain an integral relationship amongst each other and loss of adhesion does not occur.

For example, fourth layer 50 can be in the form of strips, individual segments (dots, circles, squares, etc.) and likewise, fifth layer adhesive 60 would match such configurations.

Fourth layer 50 can be assembled as a "frame"; that is a portion of hook assembly 51 (or the flexible substrate) can be sized so that only a portion of the perimeter of the loop 53 layer would be contacted with hook assembly 51 (shown in FIG. 4). Again, the frame can be as a series of individual segments (dots, circles, squares, strips as shown) and can include only 2 sides of the perimeter.

Third layer, adhesive 40, can be applied to the "frame" and then adhered to third layer 30, contacting the adhesive 40 to reinforcement layer 35. Ultimately, the construct can be heat sealed to substrate 20 via bondable layer 80.

Optionally, device/architectural membrane system 10 can further include flap 100, not shown, that can be adhered to substrate 20 and configured to cover or overlay the surface of photovoltaic device 70, thereby preventing water, snow, dirt, ice, etc. from infiltrating into the bonded layers of device/architectural membrane system 10.

As noted above, it should be understood that release layers can be used to protect, for example, the bonding or adhesive layers of the architectural systems described herein so that assembly can be effected on site or assembled prior to installation on site, in full or in part.

The following paragraphs enumerated consecutively from one (1) through fifty (50) provide for various aspects of the present invention. In one embodiment, in a first paragraph (1), the present invention provides a photovoltaic device/architectural membrane system comprising:

a first layer, comprising a fluoropolymer encapsulated reinforcement with a first bondable layer disposed on a second side of the first layer;

a second layer, comprising a fluoropolymer encapsulated reinforcement such that a first side provides an unencapsulated reinforcement surface and a second side has a second bondable layer disposed thereupon, such that the second side of the second layer and the second side of the first layer are bonded;

a third layer, comprising an adhesive disposed upon the unencapsulated reinforcement surface of the second layer;

a fourth layer, comprising a hook and loop engageable fastener system disposed upon the third layer;

a fifth layer, comprising an adhesive disposed upon the fourth layer; and a photovoltaic device disposed upon the fifth layer.

2. The photovoltaic device/architectural membrane system of paragraph 1, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

3. The photovoltaic device/architectural membrane system of either of paragraphs 1 or 2, wherein the reinforcement of the first layer comprises a glass, polyaramid, polyester, carbon fiber or metal fiber fabric, mesh, or nonwoven material.

4. The photovoltaic device/architectural membrane system of any of paragraphs 1 through 3, wherein the first bondable layer is a PFA, PVDF, THV, ETFE or an FEP.

5. The photovoltaic device/architectural membrane system of any of paragraphs 1 through 4, wherein the first bondable layer is on both the first and second sides.

6. The photovoltaic device/architectural membrane system of any of paragraphs 1 through 5, wherein the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

7. The photovoltaic device/architectural membrane system of any of paragraphs 1 through 6, wherein the reinforcement of the second layer comprises a glass, polyaramid, polyester, carbon fiber or metal fiber fabric, mesh, or nonwoven material.

8. The photovoltaic device/architectural membrane system of any of paragraphs 1 through 7, wherein the second bondable layer is a PFA, THV, PVDF, ETFE or an FEP.

9. The photovoltaic device/architectural membrane system of any of paragraphs 1 through 8, wherein the unencapsulated reinforcement surface of the second layer further comprises an adhesive layer.

10. The photovoltaic device/architectural membrane system of any of paragraphs 1 through 9, wherein the third layer adhesive is a neoprene rubber, a two part epoxy, butyl rubber, or a polyurethane.

11. The photovoltaic device/architectural membrane system of any of paragraphs 1 through 10, wherein the fifth layer adhesive is a neoprene rubber, a two part epoxy, butyl rubber, or a polyurethane.

12. The photovoltaic device/architectural membrane system of any of paragraphs 1 through 11, further comprising an optional bondable layer between the first bondable layer and second bondable layer.

13. The photovoltaic device/architectural membrane system of any of paragraphs 1 through 12, wherein either the first bondable layer or the second bondable layer or both, are surface treated.

14. A method to provide an photovoltaic device/architectural membrane system of any of paragraphs 1 through 13, comprising the steps:

providing a first layer, comprising a fluoropolymer encapsulated reinforcement with a first bondable layer disposed on a second side of the first layer;

providing a second layer, comprising a fluoropolymer encapsulated reinforcement such that a first side provides an unencapsulated reinforcement surface and a second side has a second bondable layer disposed thereupon;

disposing the second side of the second layer and the second side of the first layer to each other;

providing a third layer, comprising an adhesive;

disposing the third layer upon the unencapsulated reinforcement surface of the second layer;

providing a fourth layer, comprising a hook and loop engageable fastener system;
disposing the hook and loop engageable fastener upon the third layer;
providing a fifth layer, comprising an adhesive;
disposing the fifth layer upon the fourth layer; and
disposing a photovoltaic device upon the fifth layer.

15. A photovoltaic device/architectural membrane system comprising:
a first layer, comprising a fluoropolymer encapsulated reinforcement with a first bondable layer disposed on a second side of the first layer;
a second layer, comprising a fluoropolymer encapsulated reinforcement such that a first side provides an unencapsulated reinforcement surface and a second side has a second bondable layer disposed thereupon, such that the second side of the second layer and the second side of the first layer are bonded;
a third layer, comprising an adhesive disposed upon the unencapsulated reinforcement surface of the second layer;
a fourth layer, comprising a flexible substrate or a zipper assembly disposed upon the third layer;
a fifth layer, comprising an adhesive disposed upon the fourth layer; and
a photovoltaic device disposed upon the fifth layer.

16. The photovoltaic device/architectural membrane system of paragraph 15, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

17. The photovoltaic device/architectural membrane system of either of paragraphs 15 or 16, wherein the reinforcement of the first layer comprises a glass, polyaramid, polyester, carbon fiber or metal fiber fabric, mesh, or nonwoven material.

18. The photovoltaic device/architectural membrane system of any of paragraphs 15 through 17, wherein the first bondable layer is a PFA, PVDF, THV, ETFE or an FEP.

19. The photovoltaic device/architectural membrane system of any of paragraphs 15 through 18, wherein the first bondable layer is on both the first and second sides.

20. The photovoltaic device/architectural membrane system of any of paragraphs 15 through 19, wherein the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

21. The photovoltaic device/architectural membrane system of any of paragraphs 15 through 20, wherein the reinforcement of the second layer comprises a glass, polyaramid, polyester, carbon fiber or metal fiber fabric, mesh, or nonwoven material.

22. The photovoltaic device/architectural membrane system of any of paragraphs 15 through 21, wherein the second bondable layer is a PFA, THV, PVDF, ETFE or an FEP.

23. The photovoltaic device/architectural membrane system of any of paragraphs 15 through 22, wherein the unencapsulated reinforcement surface of the second layer further comprises an adhesive layer.

24. The photovoltaic device/architectural membrane system of any of paragraphs 15 through 23, wherein the third layer adhesive is a neoprene rubber, a two part epoxy, butyl rubber, or a polyurethane.

25. The photovoltaic device/architectural membrane system of any of paragraphs 15 through 24, wherein the fifth layer adhesive is a neoprene rubber, a two part epoxy, butyl rubber, or a polyurethane.

26. The photovoltaic device/architectural membrane system of any of paragraphs 15 through 25, further comprising an optional bondable layer between the first bondable layer and second bondable layer.

27. The photovoltaic device/architectural membrane system of any of paragraphs 15 through 26, wherein either the first bondable layer or the second bondable layer or both, are surface treated.

28. The photovoltaic device/architectural membrane system of any of paragraphs 15 through 27, wherein the flexible substrate provides cushioning and allows for movement in the x, y and z planes.

29. The photovoltaic device/architectural membrane system of any of paragraphs 15 through 28, wherein the flexible substrate is a foam material.

30. The photovoltaic device/architectural membrane system of paragraph 29, wherein the foam material is a polyurethane foam, an acrylic foam or a polyolefin foam.

31. A method to provide an photovoltaic device/architectural membrane system of any of paragraphs 15 through 30, comprising the steps:
providing a first layer, comprising a fluoropolymer encapsulated reinforcement with a first bondable layer disposed on a second side of the first layer;
providing a second layer, comprising a fluoropolymer encapsulated reinforcement such that a first side provides an unencapsulated reinforcement surface and a second side has a second bondable layer disposed thereupon;
disposing the second side of the second layer and the second side of the first layer to each other;
providing a third layer, comprising an adhesive;
disposing the third layer upon the unencapsulated reinforcement surface of the second layer;
providing a fourth layer, comprising a flexible substrate or a zipper assembly;
disposing the flexible substrate or zipper assembly upon the third layer;
providing a fifth layer, comprising an adhesive;
disposing the fifth layer upon the fourth layer; and
disposing a photovoltaic device upon the fifth layer.

32. A photovoltaic device/architectural membrane system comprising:
a first layer, comprising a fluoropolymer encapsulated reinforcement having a first side and a second side with a first bondable layer disposed on a second side of the first layer;
a second layer, comprising a fluoropolymer encapsulated reinforcement such that a first side provides an unencapsulated reinforcement surface, wherein the second side of the second layer and the second side of the first layer are bonded by the bondable layer there between;
a third layer, comprising an adhesive disposed upon the unencapsulated reinforcement surface of the second layer;
a fourth layer, comprising a hook and loop engageable fastener system, a flexible substrate or a zipper assembly disposed upon the third layer;
a fifth layer, comprising an adhesive disposed upon the fourth layer; and
a photovoltaic device disposed upon the fifth layer.

33. The photovoltaic device/architectural membrane system of paragraph 32, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

34. The photovoltaic device/architectural membrane system of either of paragraphs 32 or 33, wherein the reinforcement of the first layer comprises a glass, polyaramid, polyester, carbon fiber or metal fiber fabric, mesh, or nonwoven material.

35. The photovoltaic device/architectural membrane system of any of paragraphs 32 through 34, wherein the first bondable layer is a PFA, PVDF, THV, ETFE or an FEP.

36. The photovoltaic device/architectural membrane system of any of paragraphs 32 through 35, wherein the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

37. The photovoltaic device/architectural membrane system of any of paragraphs 32 through 36, wherein the reinforcement of the second layer comprises a glass, polyaramid, polyester, carbon fiber or metal fiber fabric, mesh, or nonwoven material.

38. The photovoltaic device/architectural membrane system of any of paragraphs 32 through 37, wherein the third layer adhesive is a neoprene rubber, a two part epoxy, butyl rubber, or a polyurethane.

39. The photovoltaic device/architectural membrane system of any of paragraphs 32 through 38, wherein the fifth layer adhesive is a neoprene rubber, a two part epoxy, butyl rubber, or a polyurethane.

40. The photovoltaic device/architectural membrane system of any of paragraphs 32 through 39, wherein the first bondable layer is surface treated.

41. The photovoltaic device/architectural membrane system of any of paragraphs 32 through 40, wherein the loop portion of the engageable fastener system or flexible substrate covers the surface of the photovoltaic device.

42. The photovoltaic device/architectural membrane system of any of paragraphs 32 through 41, wherein the hook portion of the engageable fastener system is configured to attach about a perimeter portion of the loop layer.

43. The photovoltaic device/architectural membrane system of paragraph 42, wherein the hook portion is configured as a frame, as individual segments, or as strips.

44. The photovoltaic device/architectural membrane system of paragraph 43, wherein the frame, segments, or strips do not completely encompass the entire perimeter portion of the loop layer.

45. The photovoltaic device/architectural membrane system of any of paragraphs 32 through 44, wherein the hook and loop portions of the engageable fastener system are interchanged.

46. The photovoltaic device/architectural membrane system of any of paragraphs 1 through 13, 15 through 30 or 32 through 45, further including an encapsulant disposed about the photovoltaic device.

47. The photovoltaic device/architectural membrane system of paragraph 46, wherein the encapsulant is an olefinic polymer or copolymer.

48. The photovoltaic device/architectural membrane system of any of paragraphs 1 through 13, 15 through 30 or 32 through 47, further including a back sheet attached to the photovoltaic device.

49. The photovoltaic device/architectural membrane system of any of paragraphs 1 through 13, 15 through 30 or 32 through 48 further comprising a segment of material adhered to the fluoropolymer encapsulated reinforcement in such a configuration so as to cover an upward facing portion of the system such that water, snow, ice, dirt or debris are distributed away from the photovoltaic device.

50. A method to provide an photovoltaic device/architectural membrane system, comprising the steps:
providing a first layer, comprising a fluoropolymer encapsulated reinforcement having a first side and a second side;
disposing a first bondable layer on the second side of the first layer;
providing a second layer, comprising a fluoropolymer encapsulated reinforcement such that a first side provides an unencapsulated reinforcement surface,
adhering the second side of the second layer and the second side of the first layer by the bondable layer there between;
disposing a third layer upon the unencapsulated reinforcement surface of the second layer, wherein the third layer comprises an adhesive;
disposing a fourth layer upon the third layer, wherein the fourth layer comprises a hook and loop engageable fastener system, a flexible substrate or a zipper assembly disposed upon the third layer;
disposing a fifth layer upon the fourth layer, the fifth layer comprising an adhesive; and
disposing a photovoltaic device upon the fifth layer.

The invention will be further described with reference to the following non-limiting Examples. It will be apparent to those skilled in the art that many changes can be made in the embodiments described without departing from the scope of the present invention. Thus the scope of the present invention should not be limited to the embodiments described in this application, but only by embodiments described by the language of the claims and the equivalents of those embodiments. Unless otherwise indicated, all percentages are by weight.

EXAMPLES

Example 1

Construction of a Photovoltaic Device/Architectural Membrane on Site Field

Ensure that the area of architectural membrane (20) (SHEERFILL® II HT) to be bonded is clean and dry.

A piece of bondable, one side unencapsulated fabric (30) (SHEERFILL® M26 OS) would be cut slightly larger than the plan pattern of the Velcro (50).

For example, a piece of 5 mil FEP film (NORTON® FEP) (80) would be cut slightly larger than the plan pattern of one side fabric (30).

The three layers would be laid up in the desired pattern in the order shown in FIG. 1. The orientation of the one side fabric (30) would be such that the bondable layer (31) is facing the 5 mil FEP (80).

Heat and pressure would be applied for a period of time adequate to melt and flow the FEP (700° F., 4 psi, 3 minutes). A heated platen on the outer side of the combined layers could be used. A release membrane (such as silicone paper or Kapton®) could be used to cover the platen surface during heating.

The platens would be removed after the weld has formed.

Adhesive (40) would be applied to the unencapsulated surface of one side fabric (30) and to the bottom side of the hook and loop fastener (50) (Velcro). Adhesive Scotch Weld 1400 DP two part epoxy could be used and applied according to manufacturer's directions.

One sided fabric (30) and Velcro (50) would be joined in the order and orientation specified in FIG. 1.

Adhesive (60) would be applied to the side of the Velcro (50) facing the photovoltaic device (70) and the bottom side of the photovoltaic device (70). Adhesive Bostik 1096 M with 9RX curing agent could be used and applied according to manufacturer's directions.

The Velcro (50) and the photovoltaic device (70) would be joined in the order and orientation specified in FIG. 1.

Example 2

Construction of a Photovoltaic Device/Architectural Membrane in a Fabrication Facility Formation of the Lower Half of the Construction:

The area of architectural membrane (20)(SHEERFILL® II HT) to be bonded was clean, dry and tensioned.

A piece of bondable, one side unencapsulated fabric (30) (SHEERFILL® M26 OS) was cut slightly larger than the plan pattern of the Velcro (50).

A piece of 3 mil FEP film (NORTON® FEP) (80) was cut slightly larger than the plan pattern of one side fabric (30).

The three layers were laid up in the desired pattern in the order shown in FIG. 1. The orientation of the one side fabric (30) was such that the bondable layer (31) was facing the 5 mil FEP (80).

Heat and pressure were applied for a period of time adequate to melt and flow the FEP (700° F., 4 psi, 3 minutes). Heated platens on either side of the combined layers were used. Release membranes (such as silicone paper or Kapton®) were used to cover the surfaces of the platens during heating.

The platens were removed after the weld was formed.

Adhesive (40) was applied to the unencapsulated surface of one side fabric (30) and to the bottom side of the lower half of the hook and loop fastener (51) (Velcro). Adhesive Bostik 1096 M with 9RX curing agent was used and applied according to manufacturer's directions.

The one sided fabric (30) and the lower half of the Velcro (51) were joined in the order and orientation specified in FIG. 1.

Formation of the Upper Half of the Construction:

Adhesive (60) was applied to the non-textured side of the upper half of the Velcro (52) and to the bottom side of the photovoltaic device (70). Adhesive Bostik 1096 M with 9RX curing agent was used and applied according to manufacturer's directions.

The upper half of the Velcro (52) and the photovoltaic device (70) were joined in the order and orientation specified in FIG. 1.

Assembly on Site:

The lower half of the preformed construction (the architectural membrane (20), FEP (80), one side fabric (30), adhesive (40) and lower half of the Velcro (51)) were assembled and installed according to standard architectural membrane procedures.

After installation, the upper half of the preformed construction (the photovoltaic device (70), adhesive (60) and upper half of the Velcro (52)) were joined to the lower half of the construction by contacting the Velcro halves and applying pressure to engage the hook and loop fasteners.

Example 3

The following provides a stepwise method of preparing, for example, an embodiment as depicted in FIGS. 3 and 4.

3001 loop 53 Velcro was attached to a Unisolar flexible module 70 with an adhesive 60 (Firestone butyl adhesive tape). One option provided with the Unisolar flexible module 70 is the availability of receiving it with butyl adhesive 60 on the back side. Alternatively, an adhesive 60 can be applied to the back side of the module.

The photovoltaic module 70 was placed with butyl adhesive 60 side up, the release paper removed, the loop material 53 (cut to size) was rolled over the butyl adhesive 60 and embedded in the butyl adhesive 60 by applying pressure to the loop 53 with a 10 pound roller.

A frame of Velcro type 752 hook material 51 was prepared. Alternatively, straight portions of hook material 51 were cut and formed into a 4 inch frame around the perimeter.

The hook material 51 was embedded into the loop material 53 by applying pressure/rolling with a 10 pound roller.

Strips of butyl adhesive 40 (with release paper on one side) were applied to the hook material 51 and rolled with a 10 pound roller.

These first four steps can be done in a factory so that the module can be sent to a building site for ready installation.

On site, one-sided PTFE coated fabric 30 (with unencapsulated surface 35) was heat sealed to a SHEERFILL substrate 20 with 5 mil FEP 80. Heat sealing was done with a 3"×5" tacker set at 680F. Dwell time for each tacker application was 2.5 minutes.

To install on site, the release sheet on the adhesive of the hook material is removed and the PV module with the hook/loop assemble is pressed onto the unencapsulated face of layer 30.

Although the present invention has been described with reference to preferred embodiments, persons skilled in the art will recognize that changes may be made in form and detail without departing from the spirit and scope of the invention. All references cited throughout the specification, including those in the background, are incorporated herein in their entirety. Those skilled in the art will recognize, or be able to ascertain, using no more than routine experimentation, many equivalents to specific embodiments of the invention described specifically herein. Such equivalents are intended to be encompassed in the scope of the following claims.

What is claimed is:

1. A photovoltaic device/architectural membrane system comprising:
    a first layer, comprising a fluoropolymer encapsulated reinforcement with a first bondable layer disposed on a second side of the first layer;
    a second layer, comprising a fluoropolymer encapsulated reinforcement such that a first side provides an unencapsulated reinforcement surface and a second side has a second bondable layer disposed thereupon, such that the second side of the second layer and the second side of the first layer are bonded;
    a third layer, comprising an adhesive disposed upon the unencapsulated reinforcement surface of the second layer;
    a fourth layer, comprising a hook and loop engageable fastener system disposed upon the third layer;
    a fifth layer, comprising an adhesive disposed upon the fourth layer; and
    a photovoltaic device disposed upon the fifth layer.

2. The photovoltaic device/architectural membrane system of claim 1, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

3. The photovoltaic device/architectural membrane system of claim 1, wherein the reinforcement of the first layer comprises a glass, polyaramid, polyester, carbon fiber or metal fiber fabric, mesh, or nonwoven material.

4. The photovoltaic device/architectural membrane system of claim 1, wherein the first bondable layer is a PFA, PVDF, THV, ETFE or an FEP.

5. The photovoltaic device/architectural membrane system of claim 1, wherein the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

6. The photovoltaic device/architectural membrane system of claim 1, wherein the second bondable layer is a PFA, THV, PVDF, ETFE or an FEP.

7. The photovoltaic device/architectural membrane system of claim 1, wherein the unencapsulated reinforcement surface of the second layer further comprises an adhesive layer.

8. A method to provide an photovoltaic device/architectural membrane system, comprising the steps:
   providing a first layer, comprising a fluoropolymer encapsulated reinforcement with a first bondable layer disposed on a second side of the first layer;
   providing a second layer, comprising a fluoropolymer encapsulated reinforcement such that a first side provides an unencapsulated reinforcement surface and a second side has a second bondable layer disposed thereupon;
   disposing the second side of the second layer and the second side of the first layer to each other;
   providing a third layer, comprising an adhesive;
   disposing the third layer upon the unencapsulated reinforcement surface of the second layer;
   providing a fourth layer, comprising a hook and loop engageable fastener system;
   disposing the hook and loop engageable fastener upon the third layer;
   providing a fifth layer, comprising an adhesive;
   disposing the fifth layer upon the fourth layer; and
   disposing a photovoltaic device upon the fifth layer.

9. A photovoltaic device/architectural membrane system comprising:
   a first layer, comprising a fluoropolymer encapsulated reinforcement having a first side and a second side with a first bondable layer disposed on a second side of the first layer;
   a second layer, comprising a fluoropolymer encapsulated reinforcement such that a first side provides an unencapsulated reinforcement surface, wherein the second side of the second layer and the second side of the first layer are bonded by the bondable layer there between;
   a third layer, comprising an adhesive disposed upon the unencapsulated reinforcement surface of the second layer;
   a fourth layer, comprising a hook and loop engageable fastener system, a flexible substrate or a zipper assembly disposed upon the third layer;
   a fifth layer, comprising an adhesive disposed upon the fourth layer; and
   a photovoltaic device disposed upon the fifth layer.

10. The photovoltaic device/architectural membrane system of claim 9, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

11. The photovoltaic device/architectural membrane system of claim 9, wherein the reinforcement of the first layer comprises a glass, polyaramid, polyester, carbon fiber or metal fiber fabric, mesh, or nonwoven material.

12. The photovoltaic device/architectural membrane system of claim 9, wherein the first bondable layer is a PFA, PVDF, THV, ETFE or an FEP.

13. The photovoltaic device/architectural membrane system of claim 9, wherein the fluoropolymer of the second layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

14. The photovoltaic device/architectural membrane system of claim 9, wherein the reinforcement of the second layer comprises a glass, polyaramid, polyester, carbon fiber or metal fiber fabric, mesh, or nonwoven material.

15. The photovoltaic device/architectural membrane system of claim 9, wherein the loop portion of the engageable fastener system or flexible substrate covers the surface of the photovoltaic device.

16. The photovoltaic device/architectural membrane system of claim 9, wherein the hook portion of the engageable fastener system is configured to attach about a perimeter portion of the loop layer.

17. A method to provide an photovoltaic device/architectural membrane system, comprising the steps:
   providing a first layer, comprising a fluoropolymer encapsulated reinforcement having a first side and a second side;
   disposing a first bondable layer on the second side of the first layer;
   providing a second layer, comprising a fluoropolymer encapsulated reinforcement such that a first side provides an unencapsulated reinforcement surface,
   adhering the second side of the second layer and the second side of the first layer by the bondable layer there between;
   disposing a third layer upon the unencapsulated reinforcement surface of the second layer, wherein the third layer comprises an adhesive;
   disposing a fourth layer upon the third layer, wherein the fourth layer comprises a hook and loop engageable fastener system, a flexible substrate or a zipper assembly disposed upon the third layer;
   disposing a fifth layer upon the fourth layer, the fifth layer comprising an adhesive; and
   disposing a photovoltaic device upon the fifth layer.

* * * * *